United States Patent
Hwang

(10) Patent No.: US 6,368,153 B1
(45) Date of Patent: Apr. 9, 2002

(54) SMALL FORM-FACTOR PLUGGABLE TRANSCEIVER CAGE

(75) Inventor: Jeng-Yih Hwang, Irvine, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/991,320

(22) Filed: Nov. 16, 2001

(51) Int. Cl.[7] .............................................. H01R 13/648
(52) U.S. Cl. ...................... 439/607; 439/353; 439/357
(58) Field of Search ................................ 439/607, 76.1, 439/567, 92, 95, 108, 353, 357

(56) References Cited

U.S. PATENT DOCUMENTS 6,135,790 A * 10/2000 Huang et al. ............... 439/607
6,142,828 A * 11/2000 Pepe ........................... 439/607
6,165,014 A * 12/2000 Kao et al. ................... 439/607
6,178,096 B1 * 1/2001 Flickinger et al. .......... 361/816
6,203,336 B1 * 3/2001 Nakamura ................... 439/607

* cited by examiner

Primary Examiner—Tho D. Ta
(74) Attorney, Agent, or Firm—Wei Te Chung

(57) ABSTRACT

An SFP cage includes two sidewalls, a sidewall cover, a top plate, a bottom wall and a rear cover. The cage is preferably made from a single piece of metal plate. A plurality of inward grounding spring tabs formed on the top plate and the sidewalls project into the cage for contacting an SFP module. The inward grounding spring tabs cooperate with outward grounding spring tabs of the cage to provide multiple grounding paths and prevent EMI. A plurality of compliant legs, needle eye legs and support legs depend from the sidewalls. The compliant and needle eye legs are extended through a PCB, and prevent the cage from moving during solder reflowing. The support legs abut a face of the PCB. The support legs serve as standoffs, separating the cage from the printed circuit board to facilitate accurate soldering.

13 Claims, 6 Drawing Sheets

SMALL FORM-FACTOR PLUGGABLE TRANSCEIVER CAGE

BACKGROUND OF THE INVENTION

1. Field of the Invention

The present invention relates to an optical transceiver cage, and more particularly to a small form-factor pluggable (SFP) transceiver cage of a high data transfer rate program gigabit interface converter (GBIC).

2. Description of the Related Art

Transceiver modules provide bi-directional transmission of data between an electrical interface and an optical data link. The module receives electrically encoded data signals and converts them into optical signals which are then transmitted over the optical data link. The module also receives optically encoded data signals, converts them into electrical signals, and transmits the electrical signals to the electrical interface.

Normally, the transceiver module is mounted on a printed circuit board (PCB) assembly of a host computer, an input/output system, a peripheral device, or a switch. An SFP transceiver module connects with a metal cage assembly mounted on the PCB. The metal cage generally has two parallel sidewalls, a rectangular top, a rectangular bottom, and front and rear ends. The metal cage provides easy interconnection, and is easily installed on the PCB. The cage functions to dissipate electrostatic buildup, and serves as an electromagnetic shield.

A conventional cage forms legs for supporting the cage on the PCB, and a plurality of outwardly projecting grounding tabs adjacent an entrance of the cage for engaging with a grounding chassis. However, there are no structures specifically for ground contacting a housing of an SFP transceiver module which is secured in the cage. The cage does not provide adequate protection for the connecting interface from electromagnetic interference (EMI). In addition, there is no board locking mechanism to safeguard reflowing of solder during soldering of the cage to the PCB. The cage is liable to disengage from the PCB, causing poor soldering.

SUMMARY OF THE INVENTION

Accordingly, an object of the present invention is to provide an SFP transceiver cage which has a plurality of outward and inward grounding spring tabs to facilitate grounding and prevent EMI.

Another object of the present invention is to provide an SFP transceiver cage having legs that enable the cage to be locked on a PCB during soldering of the cage to the PCB.

A further object of the present invention is to provide a sturdy one-piece SFP transceiver cage that is easily and inexpensively made from a single metal plate.

To achieve the above objects, an SFP cage in accordance with a preferred embodiment of the present invention comprises two sidewalls, a sidewall cover, a top plate, a bottom wall and a rear cover. The cage is preferably made from a single piece of metal plate. A plurality of inward grounding spring tabs formed on the top plate and the sidewalls project into a central cavity of the cage for contacting a housing of an SFP module secured in the cage. The inward grounding spring tabs cooperate with outward grounding spring tabs of the cage to provide multiple grounding paths and prevent EMI. A plurality of compliant legs, needle eye legs and support legs depends from the sidewalls. The compliant and needle eye legs are extended through corresponding holes defined in a PCB. The compliant and needle eye legs prevent the cage from moving relative to the PCB during the course of solder reflowing. The support legs abut a face of the PCB. The support legs serve as standoffs, separating the cage from the PCB to facilitate accurate soldering.

Other objects, advantages and novel features of the present invention will be apparent from the following detailed description of preferred embodiments thereof with reference to the attached drawings, in which:

DETAILED DESCRIPTION OF THE PREFERRED EMBODIMENTS

Figure 1:
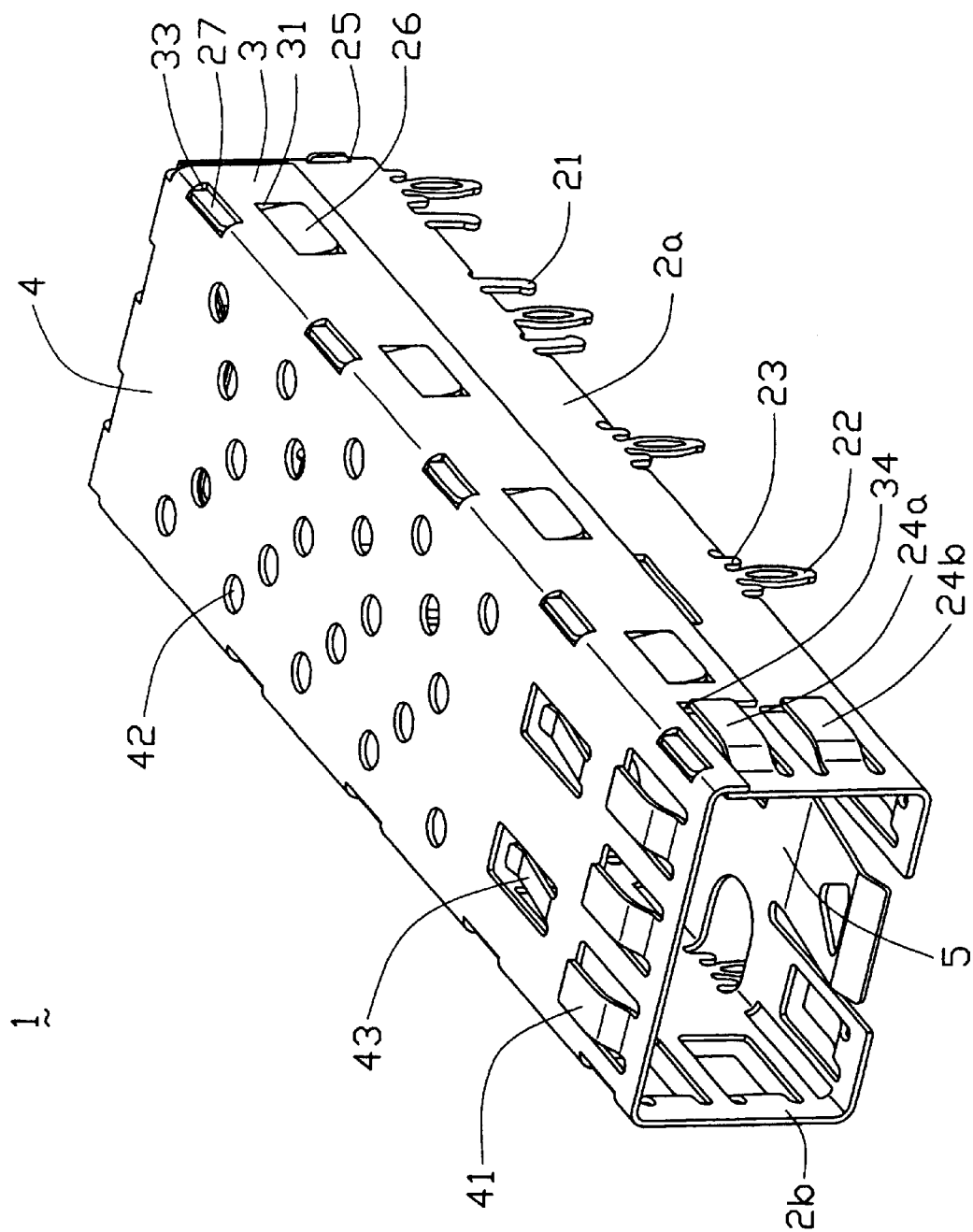
FIG. 1 is a perspective view of an SFP transceiver cage in accordance with a preferred embodiment of the present invention.
Figure 2:
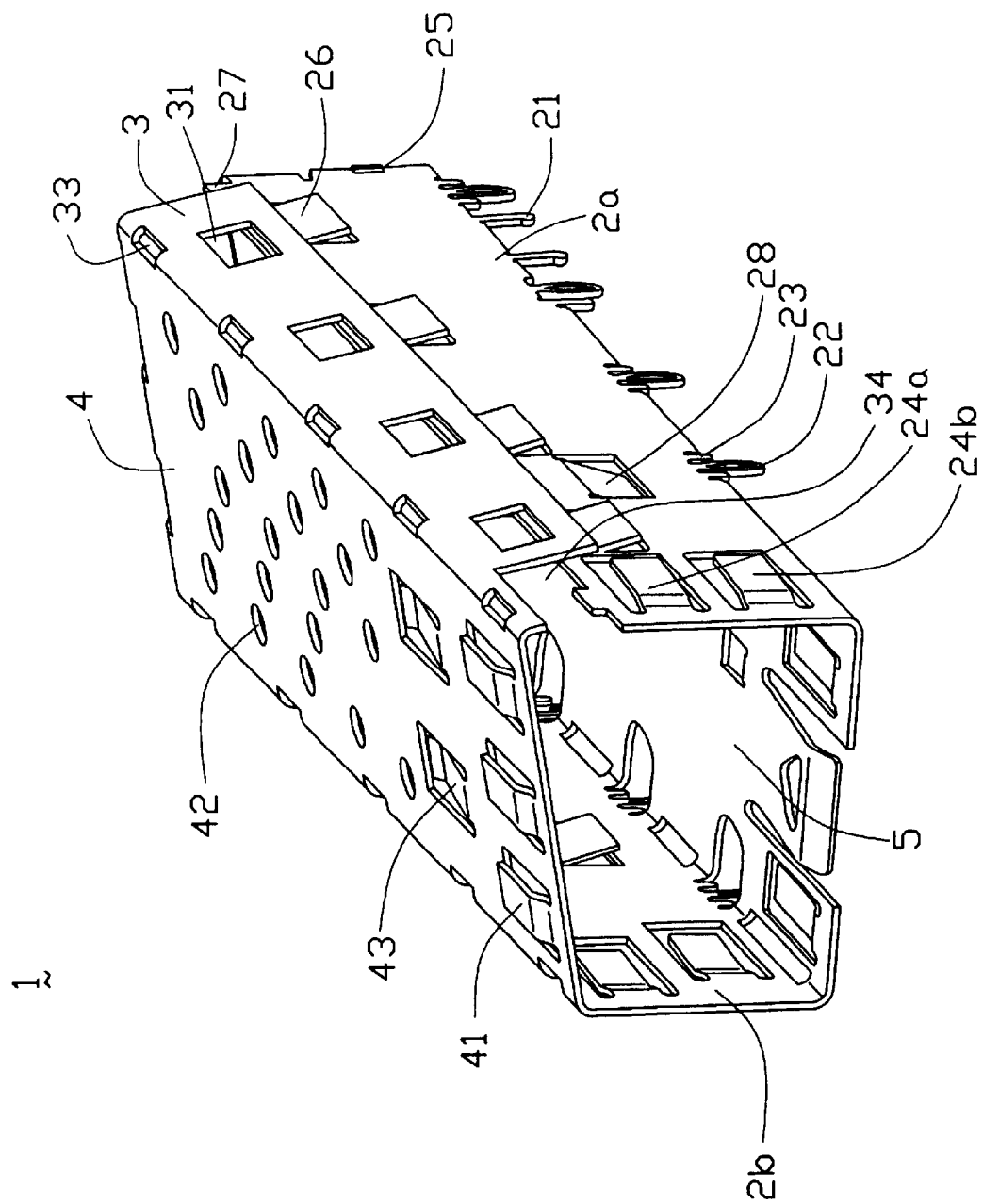
FIG. 2 is similar to FIG. 1, but showing the cage prior to assembly thereof.
Figure 3:
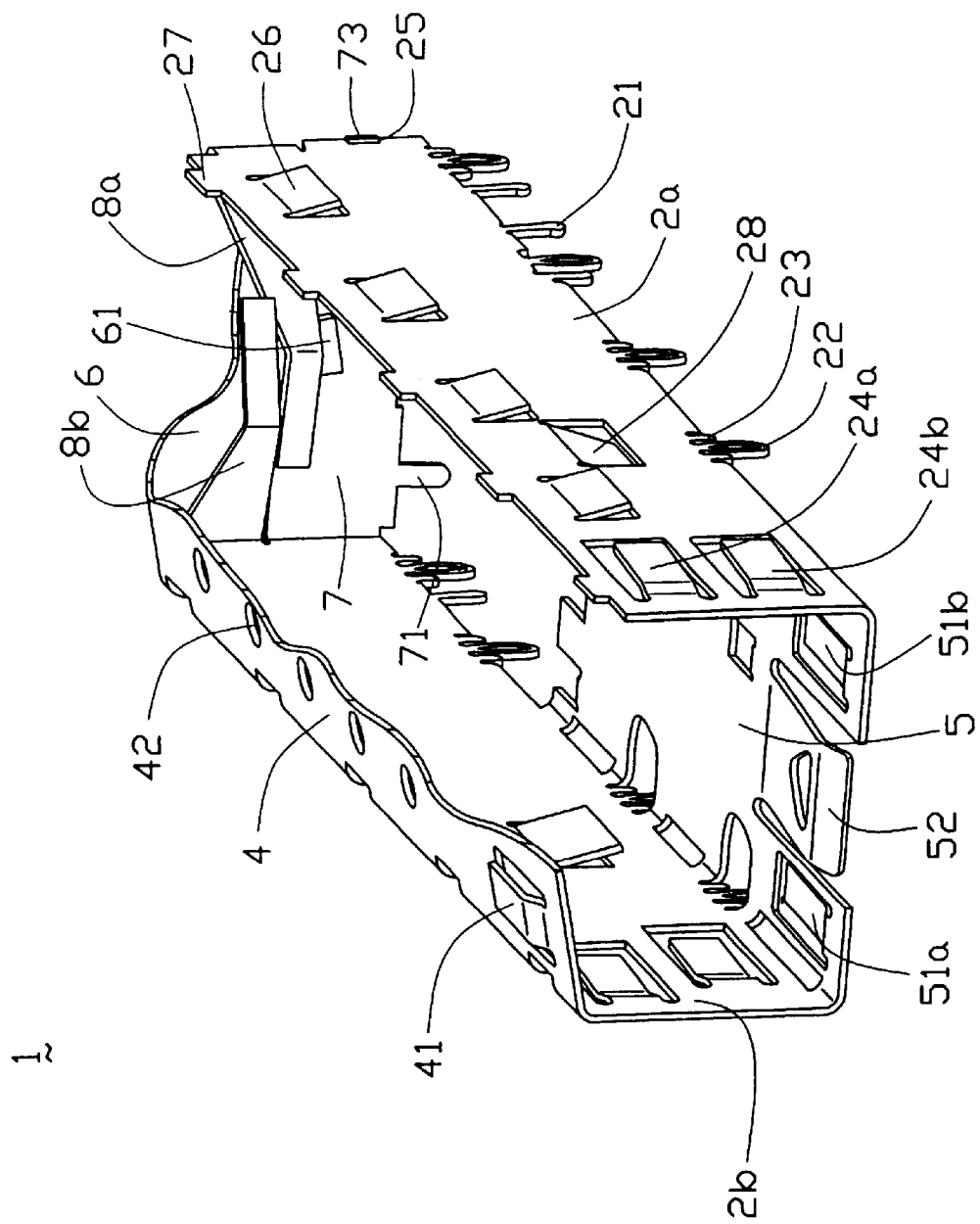
FIG. 3 is similar to FIG. 2, but with a portion of the cage cut away for clarity.

Referring to FIGS. 1–3, a small form-factor pluggable (SFP) transceiver cage 1 in accordance with a preferred embodiment of the present invention comprises a first sidewall 2a, a second sidewall 2b, a sidewall cover 3, a top plate 4, a bottom wall 5, a rear cover, and two spring arms 8a, 8b. The rear cover includes an outer panel 6 and an inner panel 7. The cage 1 is generally parallelepiped, and preferably made from a single piece of blank material such as a metal plate. The cage 1 may alternatively be made from two pieces of blank material.

Each sidewall 2a, 2b forms two outward grounding spring tabs 24a, 24b proximate a front end thereof, an inward grounding spring tab 28 rearward of the outward grounding spring tabs 24a, 24b, and a plurality of compliant legs 21, needle eye legs 22 and support legs 23 depending from a lower edge thereof. The first sidewall 2a also forms a plurality of resilient clasps 26 along an upper portion thereof, and a plurality of locating tabs 27 along a top edge thereof. A small notch 25 is defined in a rear edge of the first sidewall 2a. The spring arms 8a, 8b inwardly extend generally perpendicularly from rear edges of the first and second sidewalls 2a, 2b respectively.

Figure 5:
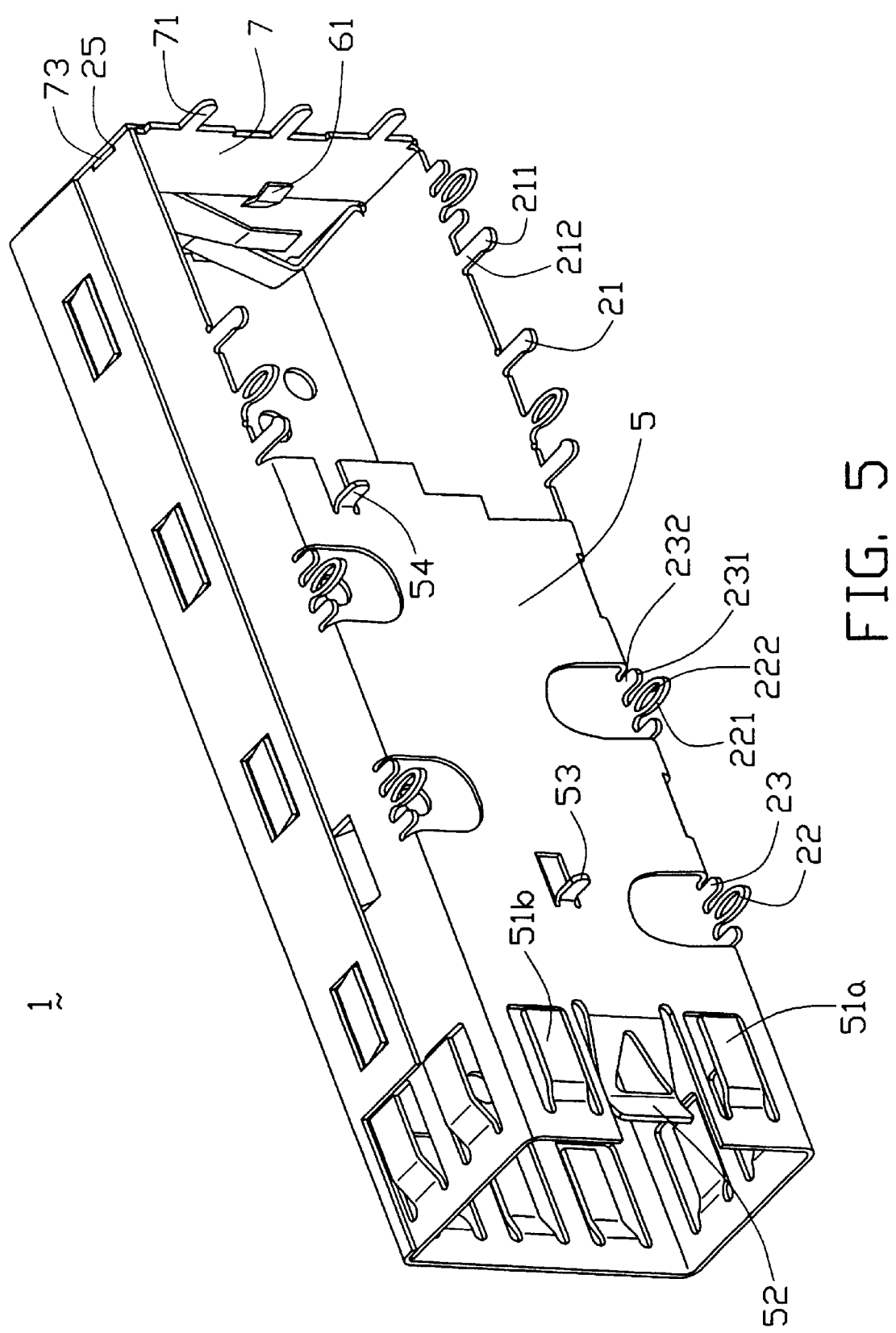
FIG. 5 is similar to FIG. 1, but viewed from a bottom aspect.

Referring particularly to FIG. 5, the compliant legs 21, needle eye legs 22 and support legs 23 are all substantially co-planar with their respective corresponding sidewalls 2a, 2b. Each compliant leg 21 comprises an elongate body 212, and an offset rounded end 211. The offset rounded end 211 is offset such that it slightly extends either toward a front of the cage 1, or toward a rear of the cage 1. Each needle eye leg 22 comprises an elliptical body 221, and an elliptical hole 222 defined in a middle of the elliptical body 221. A width of the elliptical body 221 is dimensioned so that the needle eye leg 22 can press-fit into a corresponding hole defined in a printed circuit board (PCB). Each support leg 23 comprises an elongate body 232, and a rounded end 231.

Referring back to FIGS. 1 and 2, the sidewall cover 3 extends from the top plate 4 and overlaps the first sidewall 2a. A plurality of openings 31 is defined in the sidewall cover 3, for engagingly receiving the clasps 26 of the first sidewall 2a. A plurality of rectangular slots 33 is defined in a junction of the sidewall cover 3 and the top plate 4, for engagingly receiving the locating tabs 27 of the first sidewall 2a. The sidewall cover 3 defines a cutout 34 in a front portion thereof, for accommodating the spring tab 24a of the first sidewall 2a.

The top plate 4 forms three outward grounding spring tabs 41 at a front portion thereof, and two inward grounding spring tabs 43 rearward of the outward grounding spring tabs 41. A plurality of holes 42 is defined in middle and rear portions of the top plate 4.

Figure 4:
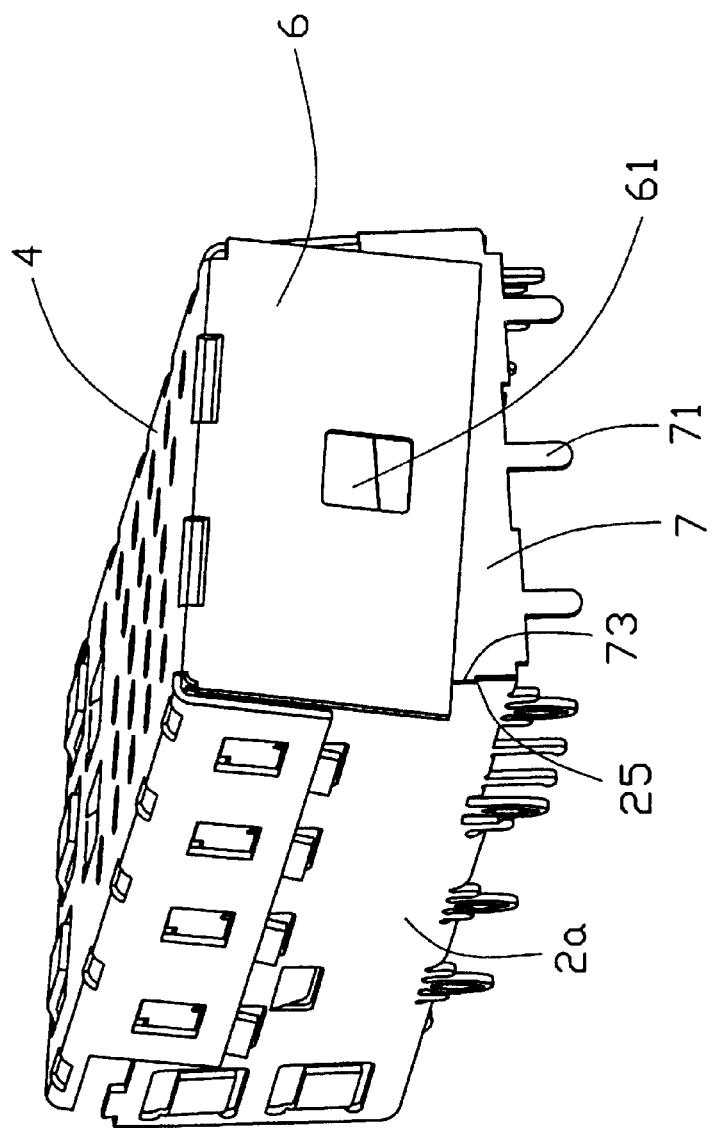
FIG. 4 is similar to FIG. 2, but viewed from a rear aspect.

Referring to FIGS. 3–5, the outer panel 6 of the rear cover extends from the top plate 4. An inward spring tab 61 extends from an inner face of the outer panel 6, for engaging the inner panel 7. The inner panel 7 extends from the second sidewall 2b. A plurality of legs 71 depends from a lower edge of the inner panel 7. A projection 73 is formed at a free end of the inner panel 7, for engaging in the notch 25 of the first sidewall 2a.

The bottom wall 5 is shorter than the top plate 4. A central inward locking tab 52 with a locking opening (not labeled) is formed in a front portion of the bottom wall 5, for latchably engaging with a corresponding SFP module. Two outward grounding spring tabs 51a, 51b are formed in a front portion of the bottom wall 5, on opposite sides of the central tab 52 respectively. A central leg 53 depends from the bottom wall 5 rearward of the central inward tab 52. A rear leg 54 depends from near a rear edge of the bottom wall 5.

In assembly of the cage 1, the projection 73 of the inner panel 7 is engaged in the notch 25 of the first sidewall 2a. The top plate 4 and side cover 3 are bent such that the side cover 3 is fastened over first sidewall 2a. The inward spring tab 61 of the outer panel 6 engages the inner panel 7, thereby fixing the outer panel 6 in place. The clasps 26 of the first sidewall 2a are engaged in the openings 31 of the side cover 3. The locating tabs 27 of the first sidewall 2a are engaged in the rectangular slots 33. The sidewall cover 3 is thereby secured to the first sidewall 2a, forming the cage 1. The spring arms 8a, 8b are located above the inner panel 7. The spring arms 8a, 8b facilitate resilient ejection of an SFP module from the cage 1.

Referring particularly to FIG. 5, in mounting the cage 1 to the PCB, the compliant legs 21 and needle eye legs 22 are extended through corresponding holes defined in the PCB. The offset rounded ends 211 of the compliant legs 21 resiliently press against the PCB at the corresponding holes. The needle eye legs 22 are press-fitted into the corresponding holes of the PCB. The support legs 23 abut a face of the PCB. The central and rear legs 53, 54 of the bottom wall 5 also abut the face of the PCB. The offset rounded ends 211 of the compliant legs 21 and the elliptical bodies 221 of the needle eye legs 22 lock the cage 1 on the PCB. Thus the cage 1 can be firmly and stably secured on the PCB with or without soldering. If the cage 1 is secured on the PCB with soldering, the compliant legs 21 and needle eye legs 22 prevent the cage 1 from moving relative to the PCB during the course of solder reflowing. Furthermore the support legs 23 and central and rear legs 53, 54 serve as standoffs, separating the cage 1 from the PCB to facilitate accurate soldering.

The inward grounding spring tabs 28, 43 respectively of the sidewalls 2a, 2b and top plate 4 project into a central cavity (not labeled) of the cage 1 for contacting a housing of an SFP module (not shown) secured in the cage 1. The outward grounding spring tabs 24a, 24b, 41, 51a, 51b respectively of the sidewalls 2a, 2b, top plate 4 and bottom wall 5 project out from the cage 1 for contacting external grounding sources. The inward grounding spring tabs 28, 43 and outward grounding spring tabs 24a, 24b, 41, 51a, 51b cooperate to provide multiple grounding paths and prevent electromagnetic interference (EMI).

Figure 6:
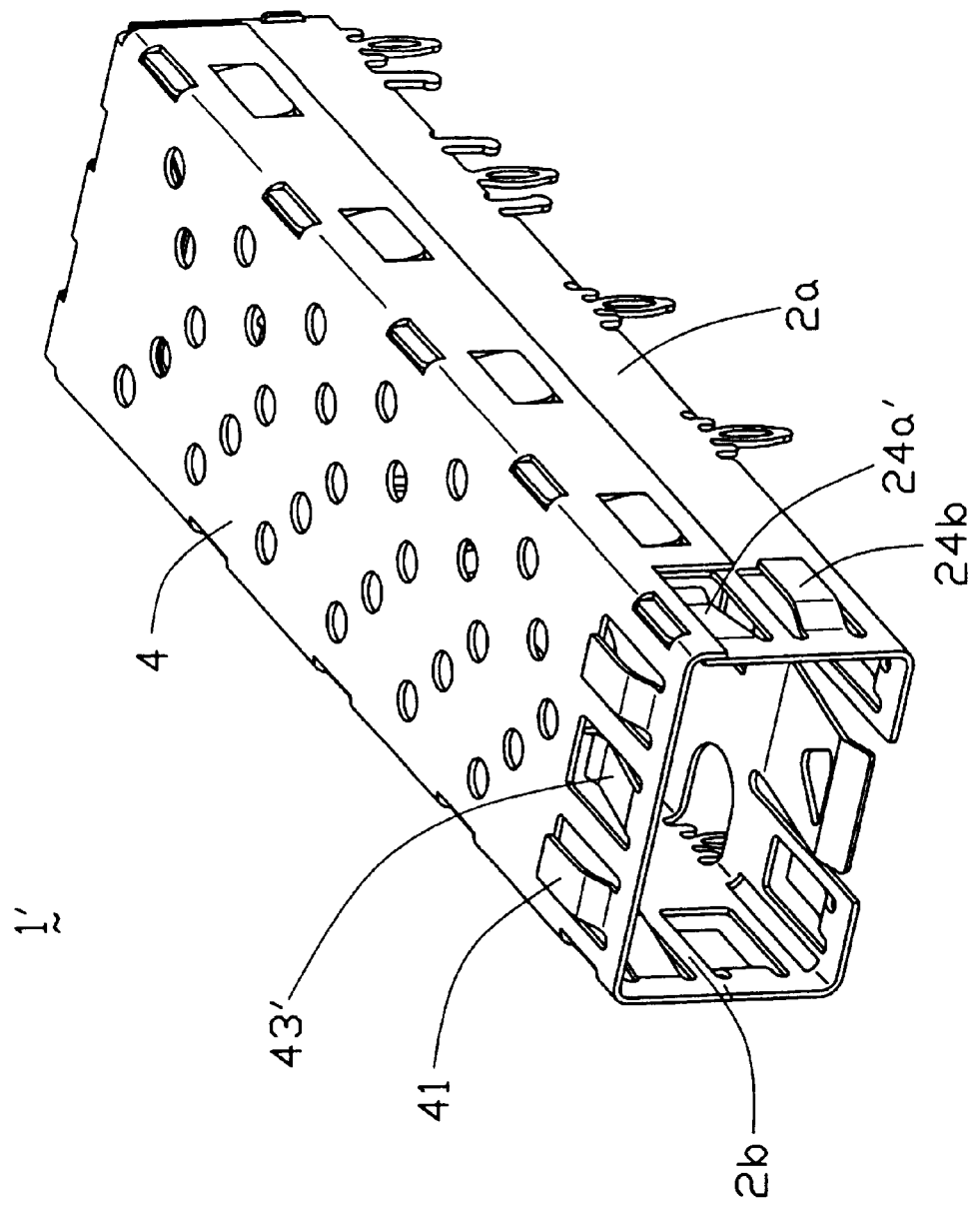
FIG. 6 is a perspective view of an SFP transceiver cage in accordance with an alternative embodiment of the present invention.

Referring to FIG. 6, an SFP transceiver cage 1' in accordance with an alternative embodiment of the present invention has a structure similar to that of the cage 1 of the preferred embodiment. The cage 1' is preferably made of metal. The cage 1' has an inward grounding spring tab 24a' formed on each of the sidewalls 2a, 2b, instead of the outward grounding spring tab 24a of the preferred embodiment. The cage 1' also has only one inward grounding spring tab 43' and only two outward grounding spring tabs 41 formed on the cover 4, instead of the two inward grounding spring tabs 43 and three outward grounding spring tabs 41 of the preferred embodiment. The inward grounding spring tab 43' is formed between the two outmost outward grounding spring tabs 41.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A small form-factor pluggable transceiver cage comprising:
   a top plate;
   a bottom wall;
   a rear cover;
   two sidewalls; and
   a sidewall cover,
   wherein a plurality of outward spring tabs and inward spring tabs is formed on the cage, and the cage is made from a single piece of metallic material,
   wherein the rear cover comprises an inner panel and an outer panel, the inner panel extends from one of the sidewalls, and the outer panel extends from the top plate,
   wherein the outer panel forms a spring tab engaged with the inner panel, and
   wherein at least three legs depend from lower edges of the sidewalls, the legs comprise at least one compliant leg, at least one needle eye leg and at least one support leg, the at least one compliant leg and the at least one needle eye leg are adapted to be extended through corresponding holes in a printed circuit board, the at least one needle eye leg comprises an elliptical body and an elliptical hole defined in a middle of the elliptical body, and the at least one support leg is adapted to abut the printed circuit board.

2. The cage as described in claim 1, wherein the inward spring tabs project into the cage for contacting a corresponding small form-factor pluggable module, thereby providing multiple grounding paths and preventing electromagnetic interference.

3. The cage as described in claim 1, wherein a plurality of legs depends from lower edges of the sidewalls, at least one of the legs is adapted to be extended through at least one corresponding hole in a printed circuit board, and at least one of the legs is adapted to abut the printed circuit board.

4. The cage as described in claim 1, wherein the inward spring tabs are disposed adjacent an entrance of the cage, and project into the cage for contacting a housing of an SFP module.

5. The cage as described in claim 1, wherein the inward spring tabs are disposed on a front portion of the top plate and on front portions of the sidewalls.

6. A small form-factor pluggable transceiver cage comprising:

a top plate;

a bottom wall opposite to the top plate;

first and second parallel sidewalls positioned between the top plate and the bottom wall, the first sidewall integrally connected to the bottom wall, the second sidewall integrally connected to both the bottom wall and the top plate;

a sidewall cover depending from one edge of the top plate and at least partially overlapping the first sidewall; and a rear cover including inner and outer panels, the inner panel integrally extending from a rear edge of one of the first and second sidewalls toward the other of the first and second sidewalls, the outer panel forming a spring tab engaging with the inner panel to fix the outer panel to the inner panel; and a plurality of outward spring tabs and inward spring tabs formed on the cage, wherein the cage is made from a single piece of metallic material.

7. The cage as described in claim 6, wherein the first and second sidewalls include inward spring tabs projecting into the cage to contact a corresponding small form-factor pluggable module secured in the cage.

8. The cage as described in claim 6, wherein the inward spring tabs are adjacent an entrance of the cage.

9. The cage as described in claim 6, wherein the top plate includes inward spring tabs projecting into the cage to contact a corresponding small form-factor pluggable module secured in the cage.

10. The cage as described in claim 6, wherein a plurality of legs depends from lower edges of the sidewalls, at least one of the legs is adapted to be extended through at least one corresponding hole in a printed circuit board, and at least one of the legs is adapted to abut the printed circuit board.

11. The cage as described in claim 6, wherein the inner panel extends from the second sidewall, the inner panel has a free end opposite the second sidewall, and a projection is formed at the free end.

12. The cage as described in claim 11, wherein a notch is defined in a rear edge of the first sidewall, and the projection of the inner panel is engaged in the notch to fix the inner panel to the first sidewall.

13. A one-piece small form-factor plugable transceiver cage for use with a panel and an optical device, comprising:

a top plate;

a bottom wall opposite to the top plate;

two opposite sidewalls positioned on two sides and between said top plate and said bottom wall;

said top plate, said bottom wall and two sidewalls commonly defining a space for receiving the optical device therein along a longitudinal direction thereof;

a locking tab formed on a front portion of the bottom wall for latchably engaging with the optical device; and a plurality of grounding tabs are formed on front portions of said top plate and said two sidewalls and laterally aligned with said locking tab; wherein some grounding tabs extends inwardly for mechanically and electrically engaging the optical device inside while the remaining extend outwardly for mechanically and electrically engaging the panel outside.

\* \* \* \* \*